US011473855B2

(12) United States Patent
Fain

(10) Patent No.: US 11,473,855 B2
(45) Date of Patent: Oct. 18, 2022

(54) STRUCTURES FOR PASSIVE RADIATIVE COOLING

(71) Applicant: Romy M. Fain, Ithaca, NY (US)

(72) Inventor: Romy M. Fain, Ithaca, NY (US)

( * ) Notice: Subject to any disclaimer, the term of this patent is extended or adjusted under 35 U.S.C. 154(b) by 530 days.

(21) Appl. No.: 16/385,999

(22) Filed: Apr. 16, 2019

(65) Prior Publication Data

US 2019/0316854 A1 Oct. 17, 2019

Related U.S. Application Data

(60) Provisional application No. 62/658,146, filed on Apr. 16, 2018.

(51) Int. Cl.
*F28F 13/18* (2006.01)
*H05K 7/20* (2006.01)
(Continued)

(52) U.S. Cl.
CPC .............. *F28F 13/18* (2013.01); *F28F 21/02* (2013.01); *F28F 21/067* (2013.01); *H01L 31/00* (2013.01); *H01L 31/024* (2013.01); *H01L 31/052* (2013.01); *F25B 23/003* (2013.01); *F28F 2245/06* (2013.01); *H05K 7/20427* (2013.01)

(58) Field of Classification Search
CPC ..... F28F 13/18; F28F 2245/06; F25B 23/003; H05K 7/20427
See application file for complete search history.

(56) References Cited

U.S. PATENT DOCUMENTS 9,923,111 B2 3/2018 Fan et al.
2004/0041742 A1* 3/2004 Fink ...................... G02B 5/281 343/912

(Continued)

FOREIGN PATENT DOCUMENTS

| | | |
|---|---|---|
| CN | 102 620 266 A | 8/2012 |
| WO | WO 2016/205717 | 12/2016 |
| WO | WO 2018/062011 | 4/2018 |

OTHER PUBLICATIONS

Raman, et al., "Passive radiative cooling below ambient air temperature under direct sunlight," Nature, vol. 515, 11 pages, Nov. 27, 2014.

Zhu, et al., "Radiative cooling of solar absorbers using a visibly transparent photonic crystal thermal blackbody," Proceedings of the National Academy of Sciences of the United States of America, vol. 112, No. 40, pp. 12282-12287, Oct. 6, 2015.

(Continued)

*Primary Examiner* — Leonard R Leo
(74) *Attorney, Agent, or Firm* — Sunstein LLP

(57) ABSTRACT

Passive radiative cooling structures and apparatus manufactured with such cooling structures conserve energy needs. A flexible film transparent to visible light incorporates particles at a volume percentage larger than 25% so as to absorb and emit infrared radiation at wavelengths where Earth's atmosphere is transparent. Another film transparent to visible light is thin and flexible and configured to absorb and emit infrared radiation at wavelengths where Earth's atmosphere is transparent, wherein etchings or depositions are present on one or both surfaces. A high efficiency cooling structure has an emissive layer sandwiched between a waveguide layer and a thermal conductive layer. A solar cell panel is covered by a transparent passive radiative cooling film. A container housing an active cooling unit incorporates passive radiative cooling structures on one or more exterior surfaces.

5 Claims, 10 Drawing Sheets

(51) Int. Cl.

| | |
|---|---|
| ***F28F 21/06*** | (2006.01) |
| ***F28F 21/02*** | (2006.01) |
| ***H01L 31/024*** | (2014.01) |
| ***H01L 31/052*** | (2014.01) |
| ***H01L 31/00*** | (2006.01) |
| *F25B 23/00* | (2006.01) |

(56) References Cited

U.S. PATENT DOCUMENTS

| | | | | |
|---|---|---|---|---|
| 2004/0185276 | A1 | 9/2004 | Hara et al. | |
| 2006/0162762 | A1* | 7/2006 | Gilman | H01L 31/052 136/246 |
| 2011/0042052 | A1* | 2/2011 | Smith | F28F 13/18 165/185 |
| 2015/0338175 | A1* | 11/2015 | Raman | F28F 13/18 165/185 |
| 2017/0248381 | A1 | 8/2017 | Yang et al. | |

OTHER PUBLICATIONS

Zhai, et al., "Scalable-manufactured randomized glass-polymer hybrid metamaterial for daytime radiative cooling," Science, vol. 355, pp. 1062-1066, Mar. 10, 2017.

Zhai, et al., "Supplementary Material for Scalable—manufactured randomized glass-polymer hybrid metamaterial for daytime radiative cooling," Science, 6 pages, Feb. 9, 2017.

Rephaeli, et al., "Ultrabroadband Photonic Structures to Achieve High-Performance Daytime Radiative Cooling," Nano Letters, pp. 1457-1461, Mar. 5, 2013.

Israeli Patent Office as the International Searching Authority, Authorized Officer: Sarwat Ibrahim, International Search Report and Written Opinion of the International Searching Authority, PCT/US2019/027715, dated Jul. 21, 2019, 11 pages.

European Patent Office, Extended European Search Report, 19789182.3, 11 pages, dated Dec. 10, 2021.

Korean Intellectual Property Office, (*with English translation*), Notice of Grounds of Rejection, 14 pages, Dec. 15, 2021.

* cited by examiner 24
16
16
14
22
16
14
22
26

24
14
22
12
16
14
22

36
38
42

32
34
36
38
SKY
22

STRUCTURES FOR PASSIVE RADIATIVE COOLING

CROSS-REFERENCE TO RELATED APPLICATIONS

This patent application claims the benefit of U.S. Provisional Patent Application No. 62/658,146, filed Apr. 16, 2018. The disclosures of this application are incorporated by reference herein in their entirety.

TECHNICAL FIELD

The present invention relates to structures, uses and methods based on passive radiative cooling. As used herein, passive radiative cooling is achieved by the use of devices that emit wavelengths corresponding to the transparency windows in the Earth's atmosphere or in other surrounding environments/enclosures. For example, passive radiative cooling can be achieved outdoors using materials that emit at infrared (IR) wavelengths in the range of 7 μm to 13 μm.

BACKGROUND ART

In the phenomenon known as the "greenhouse effect", the atmosphere traps heat in the form of electromagnetic radiation. However, not all radiated wavelengths are equally trapped. For example, there is a so-called "atmospheric window" at IR radiation wavelengths between about 7 μm to 13 μm where radiation emitted from the Earth's surface leaves the atmosphere. From a thermodynamic viewpoint, a consequence of these "atmospheric windows" is that thermal radiation emitted in these wavelengths from an object on the surface of the Earth will be transferred to the cold sink of space. In this way, passive emissive cooling can be used to reduce the temperature of an object, even at the surface of the planet, much as evaporative cooling can be used to reduce temperature in a dry climate.

Radiative cooling has been demonstrated under both nighttime daytime conditions. Raman et al., "*Passive radiative cooling below ambient air temperature under direct sunlight,*" *Nature,* vol 515, Nov. 27, 2014, pp 540-544, describe a thermal photonic approach using seven layers of $HfO_2$ and $SiO_2$ that reflect incident light while emitting in the atmospheric window. With this approach, they demonstrated cooling on a rooftop of over 5 degrees Celsius in direct sunlight. Since then, this group has demonstrated a few different versions of materials that cool radiatively, including a visibly transparent etched silica photonic crystal version.

However, the approach of Raman is not practical for commercial applications requiring low-cost materials, flexibility for ease of application, smooth top surface to resist dirt collection and durability for outdoor environments. One aspect of the instant invention is to provide practical and cost-effective radiative cooling structures with high cooling capacity.

In U.S. Application US 2017/0248381, a spectrally transparent but hazy radiative cooling structure is described wherein non-polymer particles are embedded randomly in a polymeric matrix. The preferred range of particle sizes corresponds to average effective diameters of spherical particles between 1 μm and 30 μm. The preferred range of volume percentages of the particles to the polymeric matrix is from 2% to 25%. While particles within the above size range and volume percentages are well suited for capturing and emitting IR radiation in the wavelength range from 7 μm to 13 μm, light scattering is a problem that leads to a significant loss of transparency.

Significant energy expenditures are required to refrigerate products in cargo temperature-controlled truck trailers. Each year the refrigerated trucking industry spends more than $30 B on fuel, making fuel one of their biggest expenses, even more than labor. Moreover, exhaust from burning this much diesel results in 87 MMT of $CO_2$ equivalent emissions (not including emission contributions from refrigerants, as well as the effects of waste heat produced by conventional cooling methods) and makes the refrigerated trucking industry one of the biggest polluters in the U.S. Even a modest reduction in the fuel required for refrigerated truck trailers could significantly enhance profitability for fleet owners, and at the same time provide a major reduction in polluting emissions.

Summary of the Embodiments

In accordance with aspects of the present invention, passive radiative cooling can be used to cool surfaces outdoors and can increase efficiencies of systems by offsetting heat from sources like engines, electronics, chemical reactions, and the sun (ex. high power electronics including transformers, building envelopes including windows, solar photovoltaics and battery storage, transportation including electric vehicles, water purification/distillation). Another aspect of the instant invention is to provide efficient radiative cooling structures that are transparent to visible light.

In accordance with a preferred embodiment of the invention, a passive radiative cooling structure is provided in the form of a flexible film that is transparent to visible light, and configured to absorb and emit infrared radiation at wavelengths where Earth's atmosphere is transparent. The flexible film may be fabricated from a single base material or it may have incorporated greater than 25% by volume of an embedded material.

In some embodiments, the flexible film may incorporate substantially spherical particles having a diameter greater than 30 μm. In other embodiments, particles may be incorporated that have non-spherical shapes, and have an average per particle volume greater than about 14,200 $\mu m^3$ and being small enough to fit between the top and bottom surfaces of the film.

In some embodiments, the incorporated particles may be arranged in an orderly repetitive manner within the sheet, and in other embodiments the incorporated particles may be distributed in a more random, or disorderly, but deterministicmanner.

In some embodiments, the flexible film is formed by a transparent plastic sheet and the incorporated particles are made of silica glass. In a preferred embodiment, the particles are made of fused silica glass.

In some embodiments, the embedded particles are cylindrical concave or convex sidewall structures, each sidewall structure having a first circular area bounded by a first circular area circumference and a second circular area bounded by a second circular area circumference wherein the first circular area circumference and the second circular area circumference are connected by the sidewall surface, enclosing an inner volume connecting the first circular area and the second circular area, and wherein the first and second circular areas are oriented parallel to the film surface.

In some embodiments, a passive radiative cooling structure made from a transparent flexible film is positioned on top of a panel so as to cool solar cells in the panel sufficiently and increase the efficiency of the conversion of light to electrical energy.

In other embodiments, the transparent flexible film includes a single sheet of one material, wherein etchings are present on one or both of the two parallel surfaces. The etchings may be optionally filled by another material with a refractive index more similar to the surrounding media to improve coupling between the surfaces.

In another preferred embodiment, a passive radiative cooling structure includes one or more cooling stacks. Each cooling stack of the cooling structure is configured with a waveguide layer, an emissive layer configured to absorb and emit infrared radiation at wavelengths where Earth's atmosphere is transparent, and a thermal conductive layer. In this embodiment, the emissive layer is sandwiched between the waveguide layer and the thermal conductive layer. The thermally conductive layer is in thermal contact with a source of heat to be cooled. This may be direct or through a thermally conductive interface. The thermally conductive layer can be configured substantially perpendicular to the source of heat to be cooled. These structures can be utilized on horizontal or vertical surfaces to be cooled.

In another embodiment, each cooling stack of the passive radiative cooling includes two waveguide layers, and two emissive layers, each emissive layer being configured to absorb and emit infrared radiation at wavelengths where the Earth's atmosphere is transparent, wherein the waveguide layers form the outer layers of the stack, the two emissive layers form the next outermost layers of the stack, and wherein the inner core of the stack is a thermally conductive layer, sandwiched between the two emissive layers. These structures can be utilized on horizontal or vertical surfaces to be cooled.

In accordance with a further embodiment of the invention, a refrigerated container includes a passive radiative cooling structure configured to absorb and emit infrared radiation at wavelengths where the atmosphere is transparent on the outside of the refrigerated container, in order to reduce the amount of energy required to refrigerate the container. For the passive radiative cooling structure made of a flexible film, a reflective layer may be inserted beneath the film. In other embodiments, the passive radiative cooling structure is situated on top of a thermal switching layer, which is in thermal contact with the roof of the container, wherein the thermal switching layer includes channels that can be filled, alternatively, with a heat-conducting fluid and with a heat-insulating fluid. In another preferred embodiment, a transparent passive radiative cooling structure is used to cover one or more of the container sidewalls, thereby allowing both enhanced passive cooling and the ability to allow ads or other information on the sidewalls of the container to be seen through the transparent structure.

In further embodiments, passive radiative cooling structures are configured to cool a variety of structures and devices, including but not limited to transformers, walls, rooftops, chillers in manufacturing, cooling towers, articles of apparel, vehicles including electric vehicles, shade structures, water fountains and batteries.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

Definitions. As used in this description and the accompanying claims, the following terms shall have the meanings indicated, unless the context otherwise requires:

"Substantially transparent" means allows wavelengths through sufficiently for the objects below to operate as designed within acceptable parameters, or to otherwise minimize absorption of unwanted wavelengths.

"Flexible" means that the material can flex enough to not be damaged while rolling onto a spool as is typical for roll-to-roll fabrication techniques.

Flexible, Transparent, Passive Radiative Cooling Structures

Figure 1A:
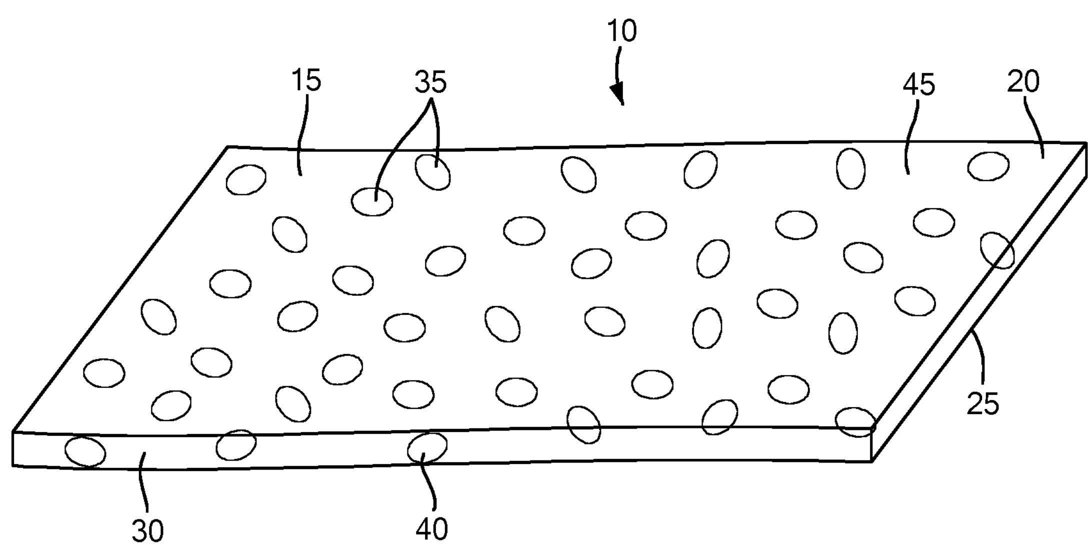
FIG. 1A shows a flexible, transparent passive radiative cooling structure of an embodiment of the invention with particles that are embedded in a disorderly manner.
Figure 1B:
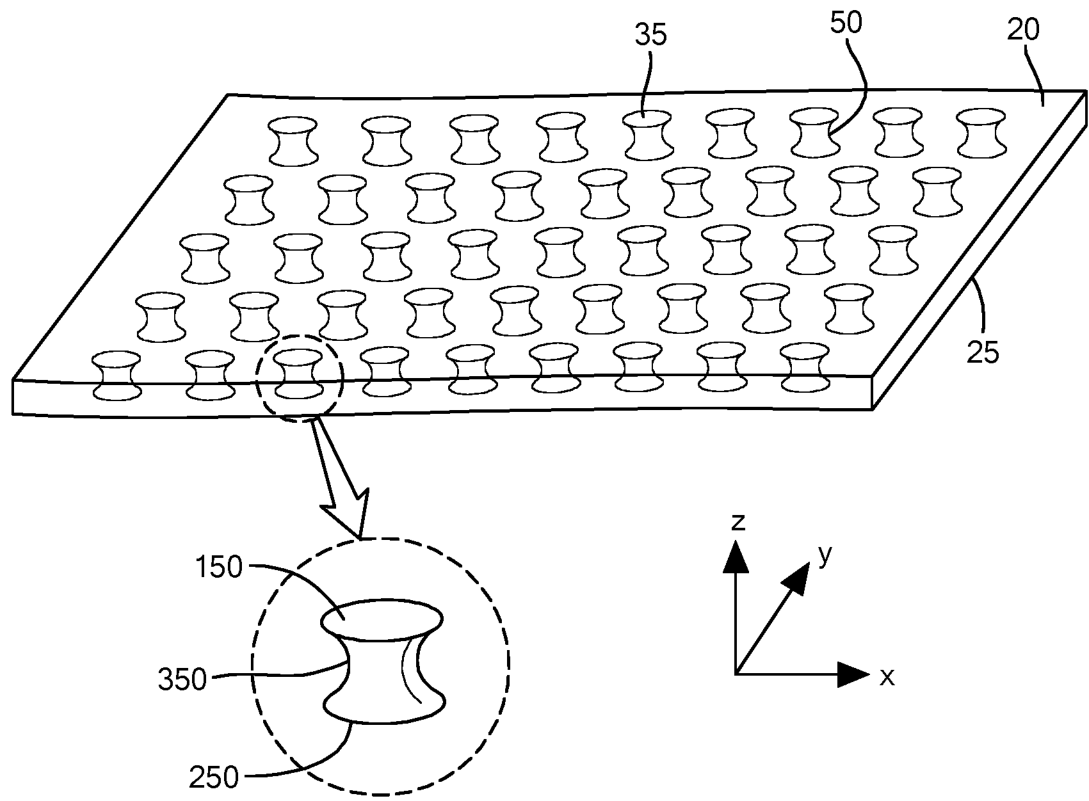
FIG. 1B shows a flexible, transparent passive radiative cooling structure of an embodiment of the invention with regularly spaced embedded concave-sidewall particles.

FIGS. 1A and 1B show a flexible, transparent passive radiative cooling structure according to embodiments of the invention. The cooling structure 10 is in the form of a flexible film 15 with a first surface 20 and a second surface 25, and an inner region 30 between the two surfaces. The cooling structure is transparent to visible light, and configured to absorb and emit infrared radiation at wavelengths where Earth's atmosphere is transparent, typically between about 7 μm to 13 μm. In these figures, embedded particles 35 of a first material 40 are distributed within a flexible film 15 formed of a second material 45. In order to minimize light scattering, and thereby maximize visible transparency, the first material 40 can be selected to have a refractive index in the visible frequency range that more closely matches the refractive index of the second material in the visible frequency range. In a preferred embodiment, the first material can be silica glass. To further minimize scattering at rough surfaces, the embedded particles 35 can be polished or flash heated. Larger particles can be utilized in order to reduce the total particle surface area over which scattering occurs for a given volume percentage of particles, thereby allowing the use of larger volume percentages of particles for a constant amount of scattering. Finally, scattering is reduced with larger feature sizes, and therefore keeping the particle size within the geometrical scattering range will reduce the scattering per particle.

The size, chemical composition and distribution of the embedded particles 35 can be controlled in order to control IR absorbance and emission intensities and bandwidths. As a consequence of using larger particles, volume fractions of particles greater than 25% may be used, and low-scattering transparency is attainable. Fortuitously, even when larger particles result in a reduced absorbance/emission maximum intensity in the desired wavelength region, and will shift the wavelength of the absorbance maximum, larger particles will also provide a broadband absorption response, thereby partially compensating for the loss of intensity at any single wavelength. The broader band distribution of wavelengths associated with larger particles can a) partially compensate for losses of intensity at a particular wavelength while still providing comparable total intensity across the atmospheric window, and b) provide a more robust ability to adapt to changes in the IR window due to changing atmospheric conditions.

Based on the above considerations of the interrelated effects of particle size and volume percentage of particles on scattering in the visible, overall absorption in the desired atmospheric windows, and the ability to perform despite changing atmospheric conditions, preferred embodiments of the disclosed invention utilize particles having an average per particle volume size of greater than 14,200 $\mu m^3$, and volume percentages above 25%. More particularly, the volume percentage in preferred embodiments is between 25% and 73%.

In FIG. 1A, the embedded particles 35 of the first material 40 are distributed in a disorderly manner within the flexible film 15 formed of the second material 45. The second material is typically a thermoplastic polymer. Preferably, the polymer is compounded and extruded. A 2 part polymer or poured polymer solution can also be used to achieve suspension of nanoparticles in a visibly transparent medium. In this figure, the particles are shown having ellipsoidal shape, but a wide variety of shapes could be used in order to fine-tune the properties of the flexible, transparent passive radiative cooling structure 10, since the particle shape will have a large effect on the phonon-polariton resonances and overall absorption spectra of the composite material. In a preferred embodiment, the particles are spheroidal in shape, with average diameters of greater than 30 μm.

In the embodiment shown in FIG. 1B, the embedded particles 35 of the first material 40 are distributed in a uniform manner within the flexible film 15. As shown in this figure, the particles have a particular concave sidewall structure 50, having a first circular area 150 and a second circular area 250 wherein the first circular area and the second circular area are connected via their circumferences by a concave surface 350, connecting the first circular area and the second circular area, and wherein the first circular area and the second circular area are oriented parallel with the first surface 20 and second surface 25 of the film 15.

Figure 1C:
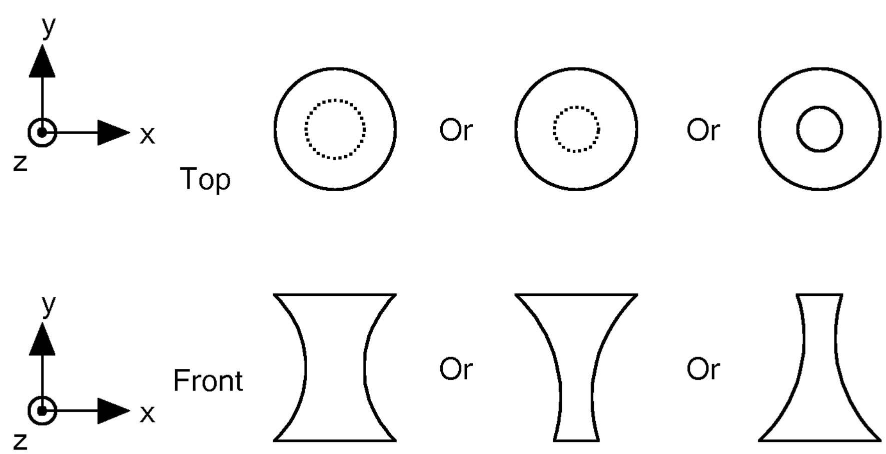
FIG. 1C shows a variety of particle shapes that can be used in the cooling structure of FIG. 1B.

As further detailed in FIG. 1C, the particles 35 may have any of a variety of shapes. The circular areas, for example, may be flat, concave or convex. The side surface of the particles may likewise be straight, concave or convex. The circular surfaces on a particle may have different diameters. The concave side surface serves to connect the circular surfaces.

Figure 2:
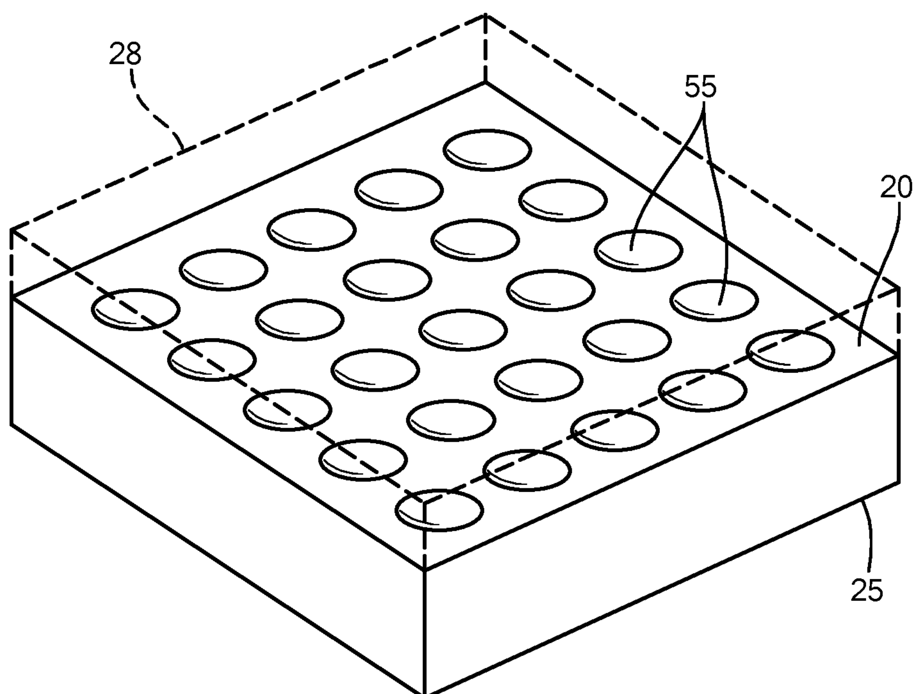
FIG. 2 shows a flexible, transparent passive radiative cooling structure of an embodiment of the invention composed of a single material, with etched outer surfaces.

In another embodiment, illustrated in FIG. 2, the flexible, transparent passive radiative cooling structure 10 is constructed of a single material, with no embedded particles. In this case, the absorption/emission of light is modulated by patterned depositions and/or etchings 55 on the first surface 20 and optionally on the second surface 25. In one embodiment, the etchings are hemispherical depressions arranged in an ordered array on the surface of the sheet. In a preferred embodiment, the single material can be a very thin sheet of bendable glass. Any of the first surface 20 or second surface 25 may be polished or flash heated to minimize surface roughness of the flexible film. In preferred embodiments, the patterned depositions and/or etchings could be irregular as produced using genetic algorithms or machine learning. The passive radiative cooling structure is thus configured for substantial transparency to visible light and emission of infrared radiation where Earth's atmosphere is transparent, typically between about 7 μm to 13 μm. Optionally, a second layer 28 may be deposited atop and/or beneath the thin sheet. The second layer 28 can be made with a conforming material having a refractive index with a value between the index of the thin sheet and the surrounding media.

Flexible thin-film absorbers can be fabricated using the device layer of standard Silicon on Insulator (SOI) wafers and/or equivalent panel or roll-to-roll versions in materials to achieve desirable optical and mechanical properties. This would work like this: 1) optional preprocessing of the device layer to enhance atmospheric window absorption as with the films described in FIGS. 1B and 2 via doping/annealing, or via etching, nanoimprinting, micromachining, deposition or other microfabrication technique to create photonic crystal structures; (2) etch the entire insulator layer beneath the device layer in order to release the top device layer; (3) process the device layer by adding polymer or other material to enhance mechanical and/or optical coupling to the front and back sides of the device layer.

Figure 3:
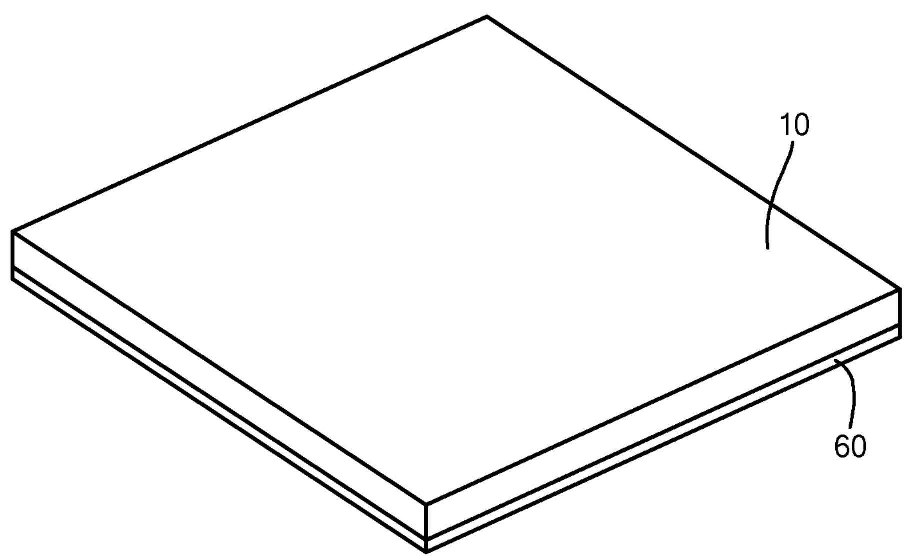
FIG. 3 shows a transparent passive radiative cooling structure layered on top of a solar panel in accordance with an embodiment of the invention.

Embodiments with a flexible, transparent passive radiative cooling structure 10, including those shown in FIGS. 1A, 1B and 2, are advantageous for applications where visible light needs to traverse the structure, but where passive radiative cooling features are advantageous. One embodiment of such an application is shown in FIG. 3. One goal of the instant invention is to provide substantially transparent radiative cooling structures to cool solar panels and thereby improve their efficiency. In this embodiment, the transparent flexible passive cooling structure 10 covers the surface of a solar panel 60. The cooling structure 10 is oriented proximate to the surface of the solar panel 60 in such a manner that the desirable cooling effects on the solar panel are achieved. Visible light passes through the flexible cooling structure 10 and electricity is generated by the solar panel. The efficiency of a solar panel increases as the temperature decreases. Even a modest decrease in temperature can dramatically improve solar cell efficiency, so long as the cooling structure is sufficiently transparent in the visible wavelengths. This improvement to solar panel function, can likewise be achieved with an inflexible passive radiative cooling structure.

In one embodiment the thin film comprising the substantially transparent passive radiative cooling structure is held in uniform contact with a surface of the solar panel, or an alternative surface to be cooled, by means of capillary forces. In a preferred method of holding the film on the solar panel or alternative surface by means of capillary forces, the film is affixed by a method involving wetting the back of the structure, disposing the structure onto the surface and squeegeeing (applying uniform linear pressure) across the surface of the structure, thereby eliminating the water and air bubbles trapped between the film and the surface, and facilitating capillary adhesion. This can be followed by adhesive application at the edges of the film to restrict the edges from peeling up and disengaging with the surface. This method of installation allows for easy de-installation as well, by removing the edge bead of adhesive and peeling up the flexible film from one edge or corner.

Figure 4:
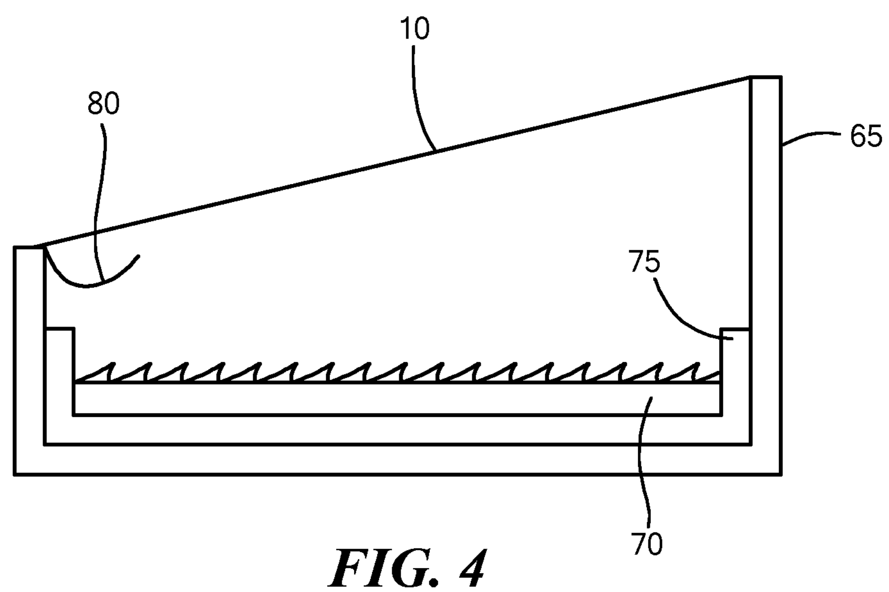
FIG. 4 shows a solar still of an embodiment of the invention that uses a transparent passive radiative cooling structure to condense water heated by sunlight.

A transparent passive radiative cooling structure 10 may be advantageously used as shown in FIG. 4. By passively providing a larger temperature differential, transparent radiative cooling structures can be employed to improve the efficiency and throughput of stills used to purify water. In this embodiment, the transparent passive radiative cooling structure 10 covers the top of a still. The remaining walls of the still are enclosed in thermal insulating material 65. At the bottom of the still, brackish water or seawater 70 is contained within boundaries of a solar-wavelength-absorbing material 75. Sunlight passes through the transparent passive radiative cooling structure 10 and heats the water 70 and the heat absorbing material 75 containing the water. As the water 70 is heated, it evaporates. By virtue of releasing energy in the form of infrared irradiation at the atmospheric window of 7-13 μm, the cooling structure 10 provides a relatively cooled surface for the evaporated water to condense on, allowing water to condense and stream towards the distillate channel 80. The distillate channel 80 captures the pure water concentrate and channels it for collection.

Radiative Cooling Multiplication by Right-Angle Deflection and Layer Stacking

Thin film based radiative cooling structures such as those described in the preceding embodiments typically give a cooling power of roughly 100 watts per square meter. Daytime cooling is further reduced by the added heat load of incoming visible and near-infrared radiation from sunlight and the surrounding environment. To achieve the cooling goal of 1 Ton of refrigeration (1 TR), 35 square meters of such radiative cooling panels are needed. Consequently, available surface area remains a limiting factor in the implementation of radiative cooling. As an added complication, the large area footprint means the heat load from the sun and the ambient environment will be partially nullifying the benefits of increased surface area.

In other embodiments of the invention, the efficiency of passive radiative cooling structures can be enhanced by right angle deflection and layer stacking. While such embodiments typically include opaque thermal conductors, preventing them from being see-through, they can provide a dramatic increase in the effective cooling panel surface area, while minimizing the surface area exposed to sunlight. Such embodiments use well-understood waveguide principles widely used in photonics and in consumer applications involving flat-panel displays.

Such embodiments make use of thin optical waveguides, which allow the IR radiation emitted over a large area to be concentrated and deflected 90 degrees to allow the radiative areas to be stacked so that a very large total surface area of radiative cooling can be housed in a much smaller area footprint. Such embodiments can thereby allow 100 square meters or more of cooling panel area to occupy 1 cubic meter, on a 1 square meter footprint. There are efficiency losses from this arrangement per each square meter of cooling panel area, but the multiplication effect on total cooling capacity, due to larger effective surface area, is greater than the losses introduced by the coupling and absorption losses in the waveguides. In addition, since the IR radiation is emitted over a much smaller area, the area that is subject to daytime heating is greatly reduced, without the addition of any special filtering.

In such embodiments, IR radiation is emitted by a radiant cooling absorber/emitter over a large area and is focused and/or coupled into a waveguide typically at an angle of 90 degrees from the cooling surface. The advantage of this arrangement is that emissive layers where cooling takes place can now be stacked in a very dense arrangement.

Figure 5B:
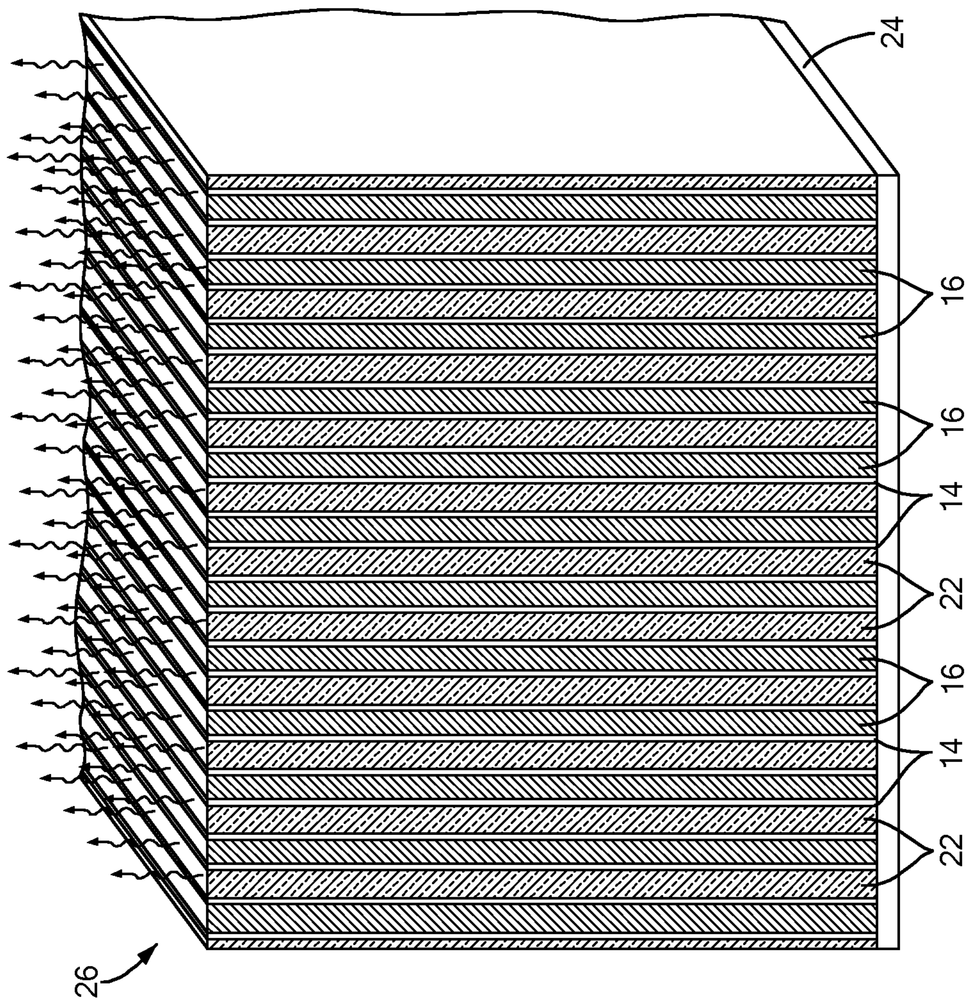
FIG. 5B shows a perspective view of a radiant cooling structure with multiple stacks of an embodiment of the invention.
Figure 5A:
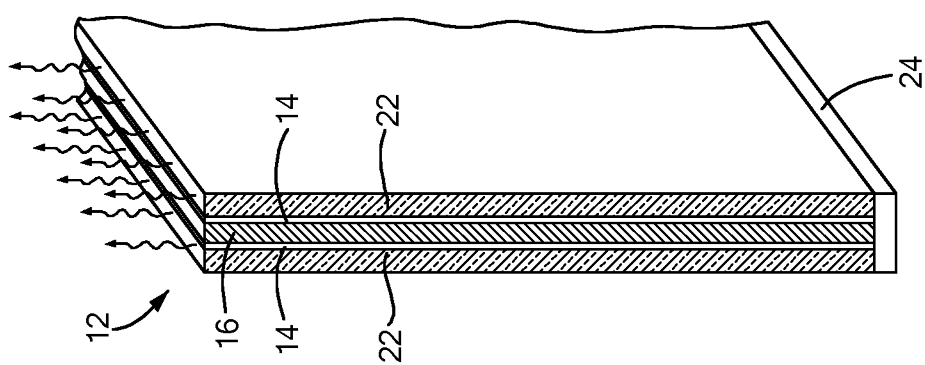
FIG. 5A shows a perspective view of a double-sided radiant cooling stack of an embodiment of the invention configured with a waveguide layer.
Figure 5C:
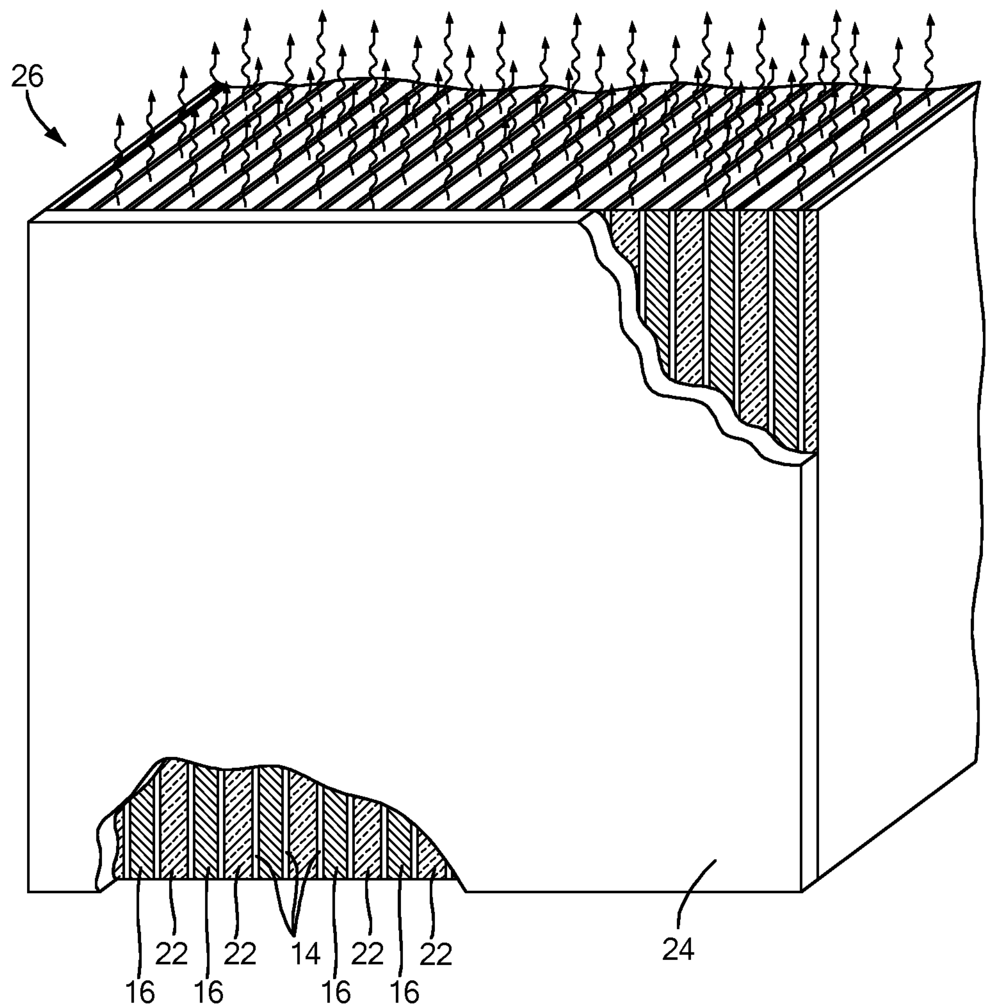
FIG. 5C shows a perspective view with a partial cutaway of a radiant cooling structure of FIG. 5B oriented for placement against a vertical surface to be cooled.

One embodiment using optical waveguides is shown in FIGS. 5A and 5B. In FIG. 5A, a double-sided radiative cooling stack 12 is shown that incorporates two waveguide layers 22, one on either exterior side of the stack. Each waveguide layer is configured to concentrate and redirect infrared radiation in the frequencies where the atmosphere is transparent. Moving inward on the stack, two emissive layers 14 are each parallel to a waveguide layer 22 on an exterior side and a centrally located thermally conductive layer 16 on an interior side. In this embodiment, each emissive layer 14 is sandwiched between a waveguide layer 22 and a thermally conductive layer 16. One end of the thermally conductive layer 16 is in thermal contact with a source of heat to be cooled or a thermally conductive interface 24 that is substantially perpendicular to the thermally conductive layer 16. The thermally conductive interface 24 is in turn substantially parallel to a source of heat to be cooled. The interface may be on the bottom opposite the sky-facing top side of the stack for horizontal orientation when in use or, as shown in FIG. 5C, the interface may be a vertical side of the stack perpendicular to the sky-facing top side for cooling a vertically oriented surface. The heat source itself, regardless whether it is horizontal, vertical or somewhere in between, may substitute for the interface 24. Alternatively, interface 24 could be preferably configured to make contact with the source of heat so as to conduct heat away from this source. The thermally conductive layer 16 may be made from a material such as a metal, in particular, copper or aluminum. The emissive layer 14 may be any of the passive radiative cooling sheets described above, or any material with designed or intrinsic emissivity in the wavelengths where the atmosphere is transparent, regardless of transparency in the visible. For example, silicon carbide, silicon nitrides, $SiO_2$, Te, PbS, PbSe, quartz ZnO and $TiO_2$. 2D materials may be integrated into an emissive layer 14 to improve emission in a thinner film, including for example, graphene, black phosphorus, boron nitride, hBN, BCN, fluorographine or graphene oxide. Particular selections and structures can be guided by optimizing to desirable transparency, reflectivity and absorption spectra, but in the multilayer cooling structure, transparency is of reduced importance. The primary purpose of the waveguide layer is to redirect and allow for propagation of thermal wavelengths towards the sky, therefore ideal waveguide layer materials are transparent to the wavelengths where the atmosphere is transparent, like polyethylene films, chalcogenide glasses, polycrystalline silver halides, sapphire, zinc monochalcogenides, CdS, CdTe, germanium, ZnSe, ZnS, and $LiNbO_3$.

In cooling operation, heat from the source of heat to be cooled is conducted through the thermally conductive layer 16. Heat from the thermally conductive layer 16 in the form of IR radiation is absorbed and emitted from the emissive layer 14 and coupled into the waveguide layer 22, where it is redirected upwards towards the sky to radiate through the atmospheric window into the depths of outer space.

FIG. 5B shows a side view of layered stacks 26 as described in FIG. 5A. With such an arrangement of stacks, it is readily apparent that the effective surface area for thermal emission can be dramatically increased, while maintaining a modest exposure to direct sunlight. Also, the waveguide layer 22 could be combined in adjacent stacks to redirect thermal wavelengths towards the sky from both sides of the waveguide layer 22.

Figure 5E:
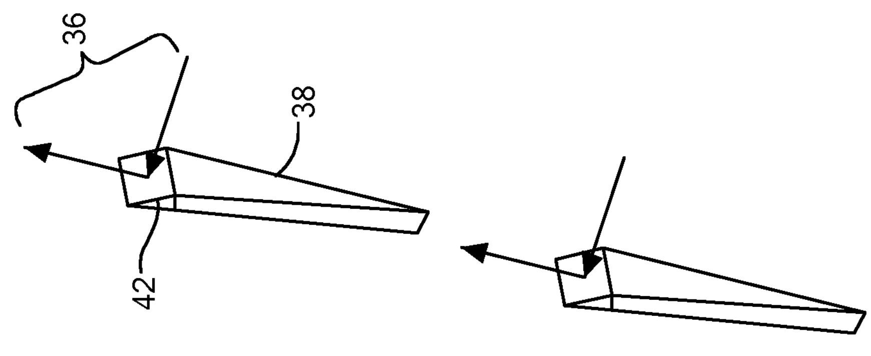
FIG. 5E shows a further expanded view of a redirecting coupling element associated with the injection sublayer of the waveguide layer of FIG. 5D.
Figure 5D:
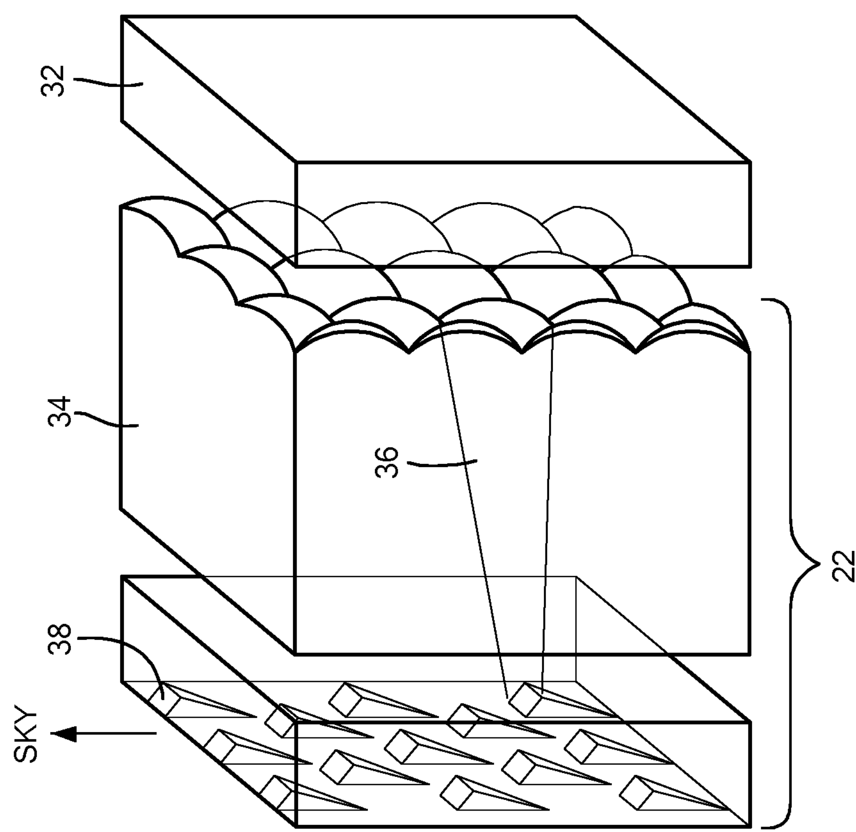
FIG. 5D shows an expanded view of microlens and injection sublayers of a waveguide layer that may form part of a radiant cooling stack of FIGS. 5A, 5B and 5C.

FIG. 5D and 5E show further detail of an embodiment of FIGS. 5A and 5B. In this embodiment, thermal energy emitting from the emissive layer 32 is collected and focused with thermal wavelength microlenses 34 that form the $1^{st}$ sublayer of the waveguide layer 22. Microlens-focused IR radiation 36 is focused onto redirecting coupling elements 38 that are embedded in the $2^{nd}$ sublayer of the waveguide layer 22. The coupling elements 38 are configured parallel to one another with each coupling element 38 having an injection facet 42 on one end, and a narrowing on the other end, and oriented within the waveguide layer such that the injection facet 42 directs the radiation skyward, and the narrowing is directed in the opposite direction. The injection facet 42 is configured to guide microlens-focused IR radiation 36 upwards toward the sky. The narrowing on the other end of the coupling element is configured to prevent light from being reflected backwards.

Note that these stacks could be configured to remove heat from surfaces in any orientation, including normal to the sky, perpendicular to the sky, and anywhere in between, for example, cooling surfaces in any orientation by changing the angle of thermal wavelength redirection and propagation in the waveguide layer to head skyward.

Passive Radiative Cooling of Containers

Figure 6A:
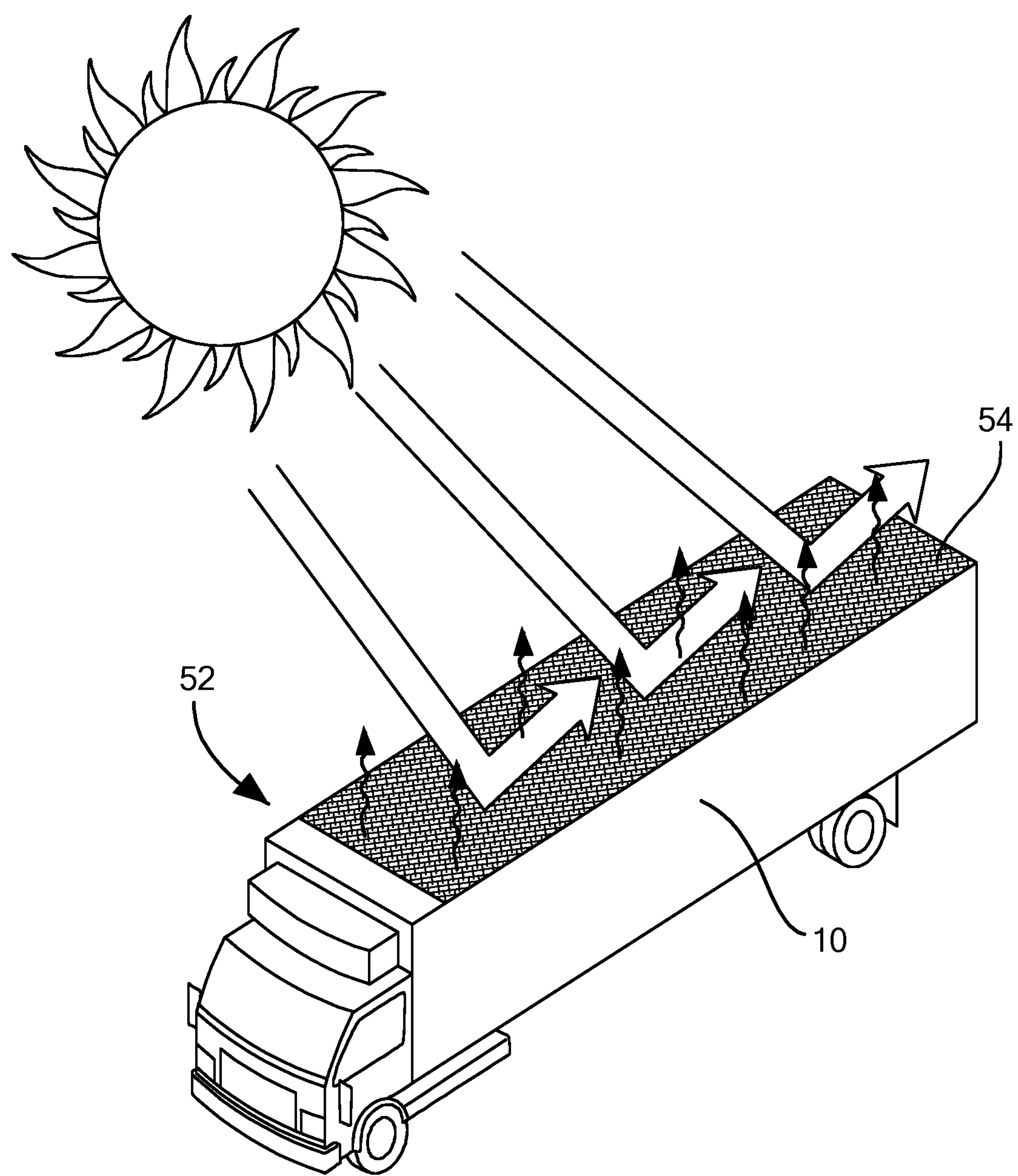
FIG. 6A shows a transport container of an embodiment of the invention.

A further goal of an embodiment of the invention is to reduce fuel usage by refrigerated cargo containers on truck trailers through the use of passive radiative cooling structures on the roofs and sides of such containers. These containers house active cooling units, such as refrigeration compressors, for maintaining a low temperature inside the container. FIG. 6A illustrates an embodiment of a refrigerated container 52, cooled by a passive radiative cooling structure 54 on a top exterior surface of the container. Further passive cooling can be provided by a transparent passive radiative cooling structure 10 on an exterior surface of one or more sides of the container to preserve signage or advertising. The passive radiative cooling structure 54 can be opaque on the top of the container, while the transparent passive radiative cooling structure 10 is configured to allow visualization of images and lettering on one or more sides of the container. The passive radiative cooling structure 54 could comprise radiant cooling stacks as set forth in FIGS. 5A and 5B. Indeed, in accordance with embodiments of the present invention the radiant cooling stacks can be use on any or all of the exterior surfaces of the container. The passive radiative cooling structure 54 could include the transparent passive radiative cooling structures set forth in FIGS. 1A, 1B or 2, which may likewise be used on any or all of the exterior surfaces of the container.

Figure 6B:
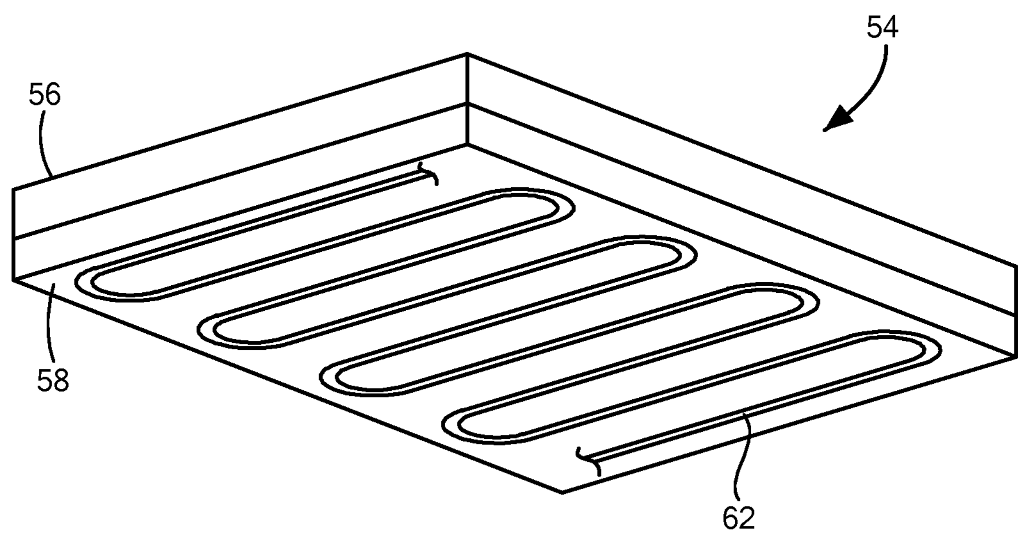
FIG. 6B shows an expanded view of the passive radiative cooling structure of FIG. 6A on top of a thermal switching layer.

In other embodiments as shown in FIG. 6B, the passive radiative cooling structure 54 may include an upper layer 56, comprising the highly efficient radiant cooling stacks or a passive radiative cooling sheet, and a lower layer 58 in thermal contact with the top of the container configured with channels 62 for thermal switching fluids. During operation, the channels can alternatively be filled with heat conducting fluids when it is desired to cool the container, or heat insulating fluids, when the goal is to prevent heat from entering the container (as when the cooling elements are indoors or otherwise obstructed from the sky). Preferred heat conducting fluids include water. Preferred heat insulating fluids include air.

The upper layer 56 could be a transparent passive cooling structure as set forth in FIGS. 1A, 1B, or 2. Since the upper layer 56 lies atop the container it need not be transparent. In a preferred embodiment, the upper layer 56 comprises radiant cooling stacks as set forth in FIGS. 5A and 5B.

Figure 6C:
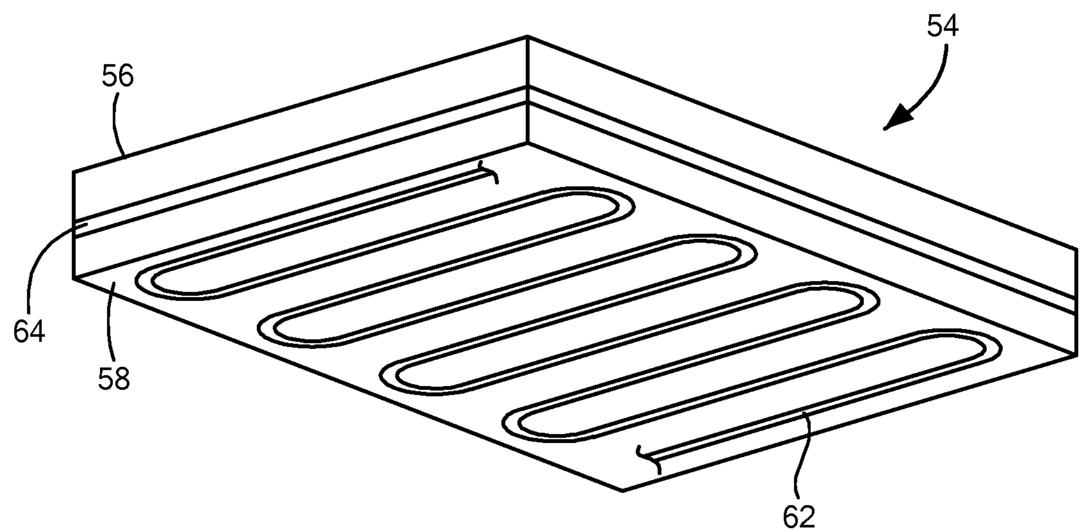
FIG. 6C shows an expanded view of an alternative embodiment of the passive radiative cooling structure of FIG. 6A on top of a thermal switching layer.

For applications of passive radiative cooling structures of FIGS. 1A, 1B, or 2 where certain wavelengths are not necessary or desired by the surface to be cooled below, the structure 10 may be backed by a reflective layer 64. The reflective layer could be configured to reflect certain unwanted wavelengths and reduce the overall thermal load. Such a reflectively backed cooling structure may be useful atop a container. As shown in FIG. 6C, a radiatively cooled container may include a passive radiative cooling structure having a thermally conductive and visibly reflective backlayer 64 sandwiched between the upper layer 56 and the lower layer 58. The reflective backlayer 64 provides a means for reducing the solar thermal load, while still allowing heat to be emissively directed away from the container 52.

Figure 6D:
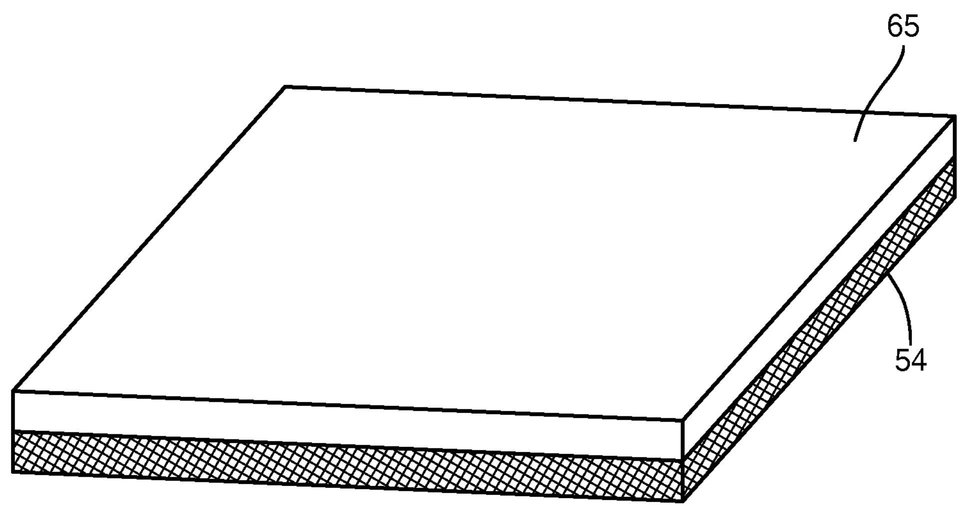
FIG. 6D shows an insulating window of an embodiment of the present invention for use with a passive radiative cooling structure.
Figure 6E:
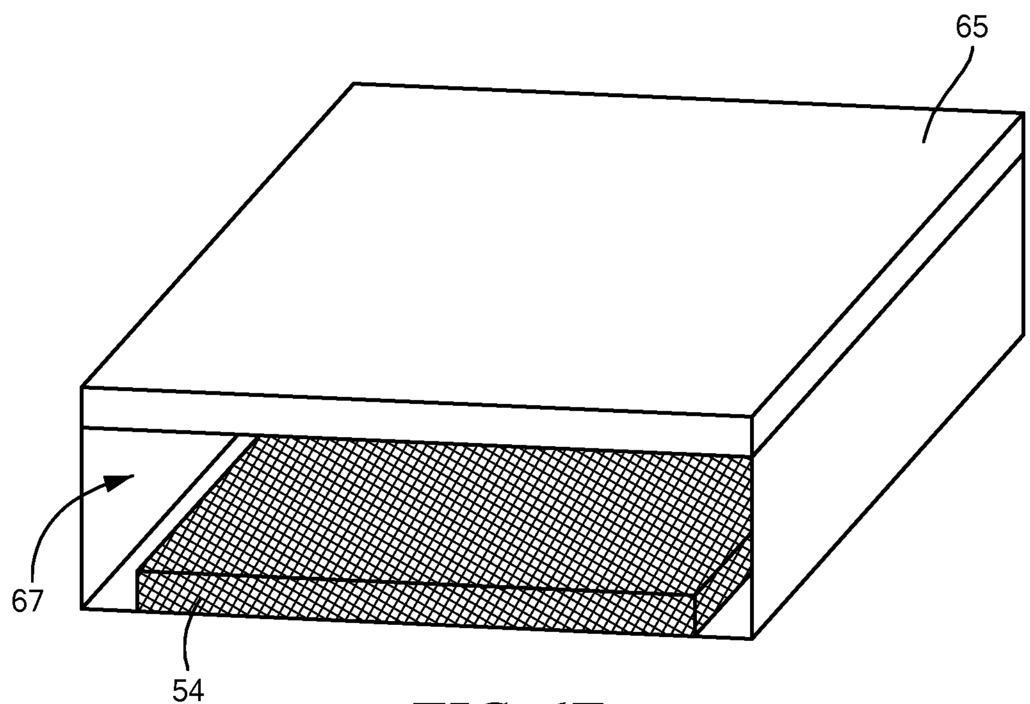
FIG. 6E shows an alternative embodiment of the insulating window for use with a passive radiative cooling structure.

In other embodiments, the passive radiative cooling structure 54 is fitted with a conductively and convectively insulating window that is transparent to wavelengths where the atmosphere is transparent. This would enhance cooling to lower temperatures, because it would inhibit warming from the surrounding media but still allow for the emissive cooling. The window could be foam 65, for example polyethylene foam, placed directly on the emissive cooling material as in FIG. 6D or installed above it with an insulating air gap 67 in between the window and the emissive material as in FIG. 6E.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A passive radiative cooling structure comprising:

one or more cooling stacks;

wherein each cooling stack is configured with a first waveguide layer, a first emissive layer and a thermal conductive layer, wherein the first emissive layer is sandwiched between the first waveguide layer and the thermal conductive layer;

wherein the first emissive layer is configured to absorb and emit infrared radiation at wavelengths where Earth's atmosphere is transparent;

wherein the thermally conductive layer has a proximal end and a distal end;

wherein the thermally conductive layer is substantially perpendicular to and in thermal contact at its proximal end with a source of heat to be cooled, wherein the first waveguide layer comprises a first sublayer and a second sublayer, and wherein the first sublayer of the first waveguide layer is configured with lenses to collect and focus the infrared radiation from the first emissive layer onto redirecting coupling elements embedded in the second sublayer of the first waveguide layer, the redirecting coupling elements configured to direct the infrared radiation from the first emissive layer upwards towards the sky, and to inhibit the infrared radiation from being reflected backwards in an opposite direction.

2. A passive radiative cooling structure according to claim 1, further comprising a window fitted over the passive radiative cooling structure that is transparent to the wavelengths where the Earth's atmosphere is transparent.

3. A passive radiative cooling structure according to claim 1, wherein the redirecting coupling elements are configured parallel to one another with each redirecting coupling element having an injection facet on one end, configured to direct the infrared radiation upwards towards the sky, and a narrowing on the other end, configured to inhibit the infrared radiation from being reflected backwards in the opposite direction.

4. A passive radiative cooling structure according to claim 1, configured to cool an object to a temperature below ambient air temperature.

5. A passive radiative cooling structure according to claim 1, wherein each cooling stack further comprises a second waveguide layer, and a second emissive layer;

wherein the second emissive layer is sandwiched between the second waveguide layer and the thermal conductive layer;

wherein the thermal conductive layer is sandwiched between the first emissive layer and the second emissive layer;

wherein the second emissive layer is configured to absorb and emit infrared radiation at wavelengths where Earth's atmosphere is transparent, wherein the second waveguide layer comprises a first sublayer and a second sublayer, and wherein the first sublayer of the second waveguide layer is configured with lenses to collect and focus the infrared radiation from the second emissive layer onto redirecting coupling elements embedded in the second sublayer of the second waveguide layer, the redirecting coupling elements configured to direct the infrared radiation from the second emissive layer upwards towards the sky, and to inhibit the infrared radiation from being reflected backwards in an opposite direction.

* * * * *